(12) United States Patent
Shim et al.

(10) Patent No.: US 7,148,141 B2
(45) Date of Patent: Dec. 12, 2006

(54) METHOD FOR MANUFACTURING METAL STRUCTURE HAVING DIFFERENT HEIGHTS

(75) Inventors: Dong-sik Shim, Paldal-gu (KR); Chan-bong Jun, Seoul (KR); Hyung Choi, Seongnam-si (KR); Hoon Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/012,312

(22) Filed: Dec. 16, 2004

(65) Prior Publication Data

US 2005/0136636 A1 Jun. 23, 2005

(30) Foreign Application Priority Data

Dec. 17, 2003 (KR) .................. 10-2003-0092620

(51) Int. Cl.
*H01L 21/44* (2006.01)
(52) U.S. Cl. ....................................... 438/667
(58) Field of Classification Search .............. 438/128, 438/141, 142, 149, 161, 104, 347, 349, 351, 438/353, 359, 381, 400, 424, 435, 455, 458, 438/466, 476, 479, 667, 597
See application file for complete search history.

(56) References Cited

U.S. PATENT DOCUMENTS

2002/0017553 A1 2/2002 Jao
2003/0080431 A1 5/2003 Uzoh et al.
2005/0045484 A1* 3/2005 Smalley et al. ............ 205/122

FOREIGN PATENT DOCUMENTS

| JP | 10-98268 A | 4/1998 |
|---|---|---|
| JP | 10-135156 A | 5/1998 |
| JP | 10135156 A | 5/1998 |

* cited by examiner

*Primary Examiner*—Michael Lebentritt
*Assistant Examiner*—Andre Stevenson
(74) *Attorney, Agent, or Firm*—Sughrue Mion, PLLC

(57) ABSTRACT

Disclosed is a method for forming a plurality of metal structures having different heights on a semiconductor substrate. The disclosed method for manufacturing a metal structure having different heights includes: forming a plurality of seed layers, to have heights corresponding to the metal structure to be formed, on a semiconductor substrate so that those layers can be electrically separated, performing a plating process using a plating mold, and applying different currents to the respective seed layers so that the plating thickness can be adjusted for each of the seed layers. Accordingly, a plurality of metal structures having different heights can be obtained by a plating mold forming process and a plating process that are performed just once, respectively.

2 Claims, 4 Drawing Sheets

METHOD FOR MANUFACTURING METAL STRUCTURE HAVING DIFFERENT HEIGHTS

CROSS-REFERENCE TO RELATED APPLICATIONS

This application claims the benefit of Korean Application No. 2003-92620, filed Dec. 17, 2003, in the Korean Intellectual Property Office, the disclosure of which is incorporated herein by reference.

BACKGROUND OF THE INVENTION

1. Field of the Invention

The present invention relates to a method for manufacturing a metal structure having different heights formed on a semiconductor substrate. For example, a portion of the metal structure is used for a semiconductor element, and another portion of the metal structure, having a different height, is used for packaging of the semiconductor element.

2. Description of the Related Art

Generally, a certain fine metal structure used for a semiconductor element needs to be packaged for protection. To accomplish this, a second fine metal structure having a height higher than the fine metal structure is usually formed on both sides of the fine metal structure for packaging the element.

FIG. 1A through FIG. 1F are drawings illustrating a general method for forming the metal structure, having different heights, for the element and packaging. Referring to FIG. 1A to FIG. 1F, the conventional method for manufacturing the metal structure having different heights will now be described.

As shown in FIG. 1A, a seed layer 2 is formed on a semiconductor substrate 1, and a first plating mold 3 having a plurality of first grooves 3a is formed through a photolithography process. The seed layer 2 is a base layer for the plating process that will be described later.

A metal is used to fill in the first grooves 3a of the first plating mold 3 through the plating process, and then, the first plating mold 3 is removed so that a first metal structure 4, having a predetermined height, that will be used for the element is formed as shown in FIG. 1B.

As shown in FIG. 1C, a second plating mold 5, having a plurality of second grooves 5a, is formed through a photolithography process on the semiconductor substrate 1 on which the first metal structure 4 is formed.

As shown in FIG. 1D, a metal is used to fill in the second grooves 5a of the second plating mold 5 through the plating process, and then, the second plating mold 5 is removed so that a second metal structure 6, having a height greater than the first metal structure 4, is formed as shown in FIG. 1E.

Finally, the unnecessary seed layer 2 is removed so that the first metal structure 4 and the second metal structure 6, having different heights with respect to each other, are formed on the semiconductor substrate 1 as shown in FIG. 1F.

In the construction of the metal structure manufactured through the foregoing processes, the first metal structure 4 is used for a semiconductor element and the second metal structure 6, disposed on both sides of the first metal structure 4, is used in packaging for the protection of the element.

However, since the conventional method for manufacturing a metal structure having different heights requires a complicated photolithography process and a plating process that must be performed twice, respectively, in the formation of the first plating mold 3 and the second plating mold 5, the whole process becomes very complicated.

Furthermore, in the conventional method, the formation of the second plating mold 5, for forming the second metal structure 6, and the corresponding plating process is performed after the first metal structure 4 is formed, therefore, the formation of the second plating mold 5 is influenced by the shape of the first metal structure 4. Thus, the process becomes very difficult and troublesome. Additionally, the substrate 1 can be contaminated due to the frequent photolithography processes, and the plating for the second metal structure 6 may become unstable.

Furthermore, if the first and the second metal structures 4 and 6 are formed with different materials, then, the seed layer 2 should be removed after the first metal structure 4 is formed and a second seed layer (not shown), which is a base layer for the formation of the second metal structure 6, should be formed. Here, a dedicated layer, such as an insulating layer, for protecting the first metal structure 4 should be provided when forming the second seed layer. Therefore, the conventional process becomes even more complicated.

SUMMARY OF THE INVENTION

An aspect of the present invention is to solve at least the above problems and/or disadvantages and to provide at least the advantages described below. Accordingly, an aspect of the present invention is to provide a method for manufacturing a metal structure having different heights, wherein the method is capable of achieving simplification of the whole process by minimizing the difficult and complicated process of forming the plating mold and performing the plating process.

In order to achieve the above and other aspects of the present invention, there is provided a method for manufacturing a metal structure having different heights comprising: forming a plurality of seed layers, which have heights corresponding to the metal structure portions to be formed on the semiconductor substrate, so that those layers can be electrically separated; performing a plating process using a plating mold; and applying different currents to the respective seed layers so that the plating thickness can be adjusted for each of the seed layers.

According to another aspect of the present invention, the method for manufacturing a metal structure having different heights comprises: forming a pattern on the seed layer to form parts on which each metal structure portion is formed and forming a plating mold having a plurality of grooves corresponding to the metal structure formation parts so that the metal structure portions made of the same material and having different heights with respect to each other can be formed by performing a plating process just once.

According to still another aspect of the present invention, the method for manufacturing a metal structure having different heights comprises: forming a pattern on the seed layer to form parts on which each metal structure portion is formed, forming a plating mold having a plurality of grooves corresponding to the metal structure formation parts, forming a first metal structure by performing a first plating process with metal of a first material and forming a second metal structure by performing a second plating process with metal of a second material.

Furthermore, the foregoing and other objects and advantages are substantially realized by providing a method for manufacturing a metal structure having different heights consistent with the present invention, which comprises the steps of: forming a first seed layer on a semiconductor substrate; depositing an insulating layer on the first seed layer and forming a second seed layer thereon; making a pattern on the second seed layer and the insulating layer; forming, on an upper part of the patterned structure, a plating mold having first grooves that correspond to the first seed layer and second grooves that correspond to the second seed layer; forming plating layers whose thicknesses are different with respect to the first grooves and the second grooves of the plating mold by performing the plating process while applying different currents on the first seed layer and the second seed layer, respectively; forming a first metal structure and a second metal structure having different heights with respect to each other by removing the plating mold and exposing the plating layer; and removing unnecessary residual portions of the first seed layer and second seed layer.

According to embodiments of the present invention having the above construction, the plating mold forming process and the plating process which are complicated and difficult may be reduced, and therefore, the method for manufacturing a metal structure having different heights can be simplified.

BRIEF DESCRIPTION OF THE DRAWINGS

The above aspect and other features of the present invention will be readily apparent by describing, in detail exemplary embodiments thereof with reference to the accompanying drawings, in which.

DETAILED DESCRIPTION OF ILLUSTRATIVE, NON-LIMITING EMBODIMENTS OF THE INVENTION

Illustrative, non-limiting embodiments of the present invention will be described in greater detail with reference to the accompanying drawings.

Figure 1A:
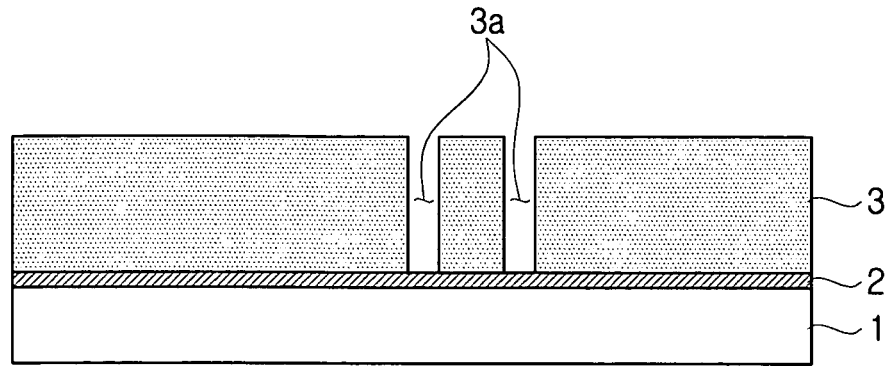
FIG. 1A through FIG. 1F are views showing the method of manufacturing a conventional metal structure having different heights.
Figure 1B:
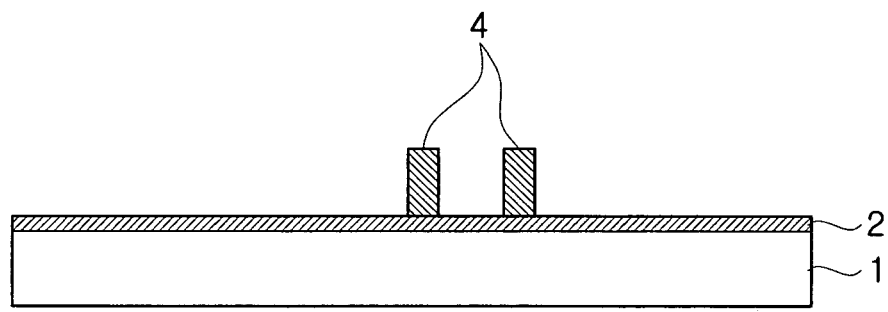
Figure 1C:
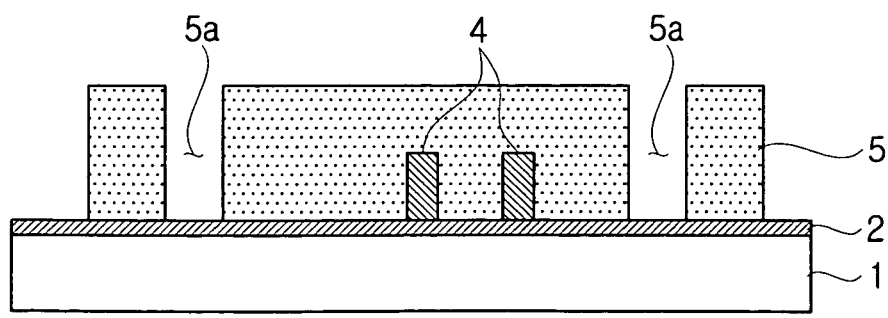
Figure 1D:
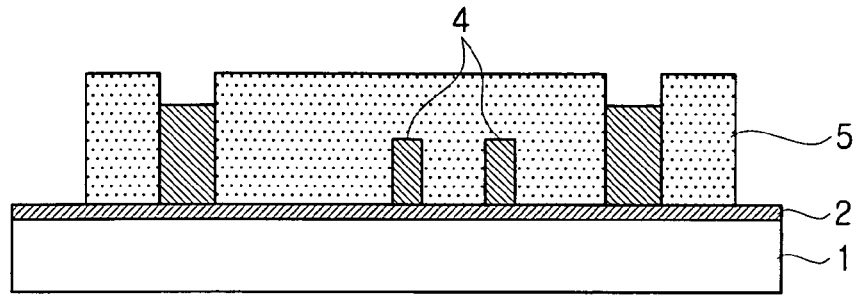
Figure 1E:
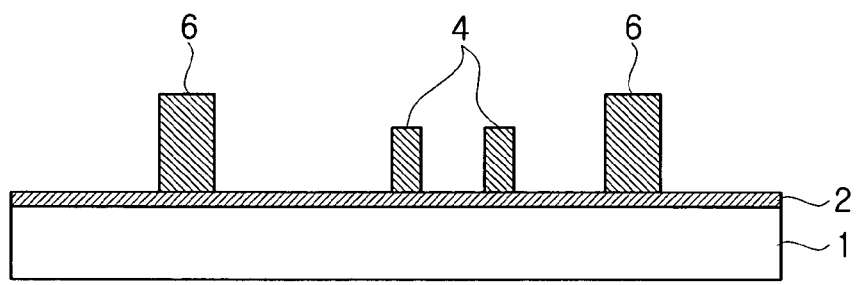
Figure 1F:
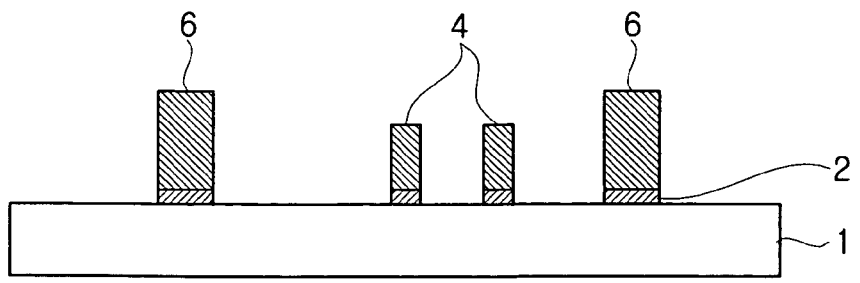
Figure 2A:
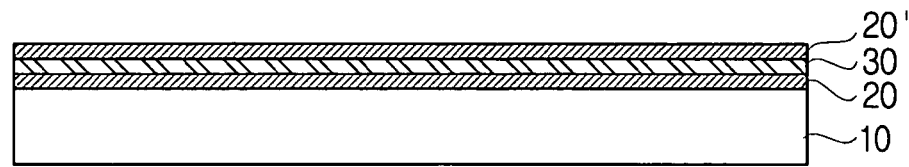
FIG. 2A through FIG. 2H are views showing the method of manufacturing a metal structure having different heights according to exemplary embodiments of the present invention.

Referring to FIG. 2A through FIG. 2H, the characteristics of the method for manufacturing a metal structure having different heights according to an embodiment of the present invention is that a plurality of layers are formed in forming a plating base layer on a semiconductor substrate 10, for example, as shown in FIG. 2A, two seed layers (a first seed layer 20 and second seed layer 20') are formed if the height difference of the metal structure to be formed is one step. The first seed layer 20 and the second seed layer 20' are electrically separated by an insulating layer 30 that is interposed between the seed layers. Although the drawings show the case of employing two seed layers 20 and 20', the number of the seed layers can be reduced or increased depending on the height difference of the metal structure to be formed.

Figure 2B:
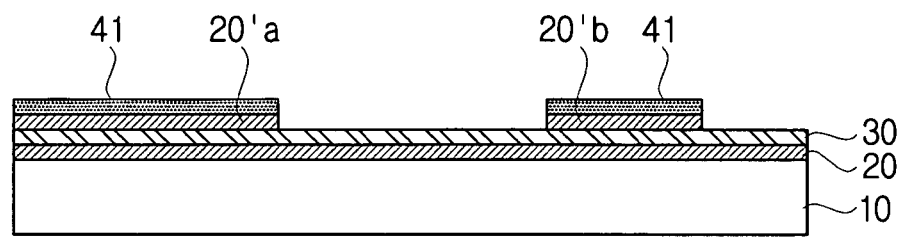
Figure 2C:
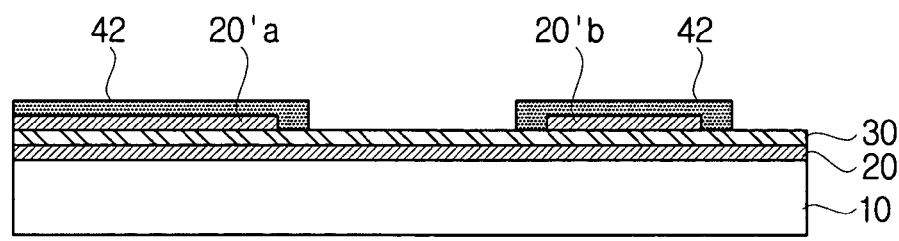
Figure 2D:
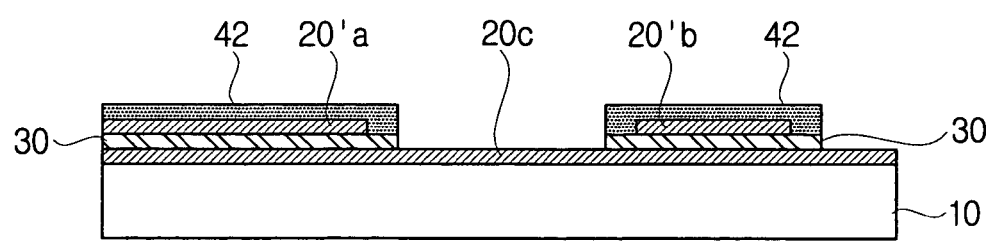
Figure 2E:
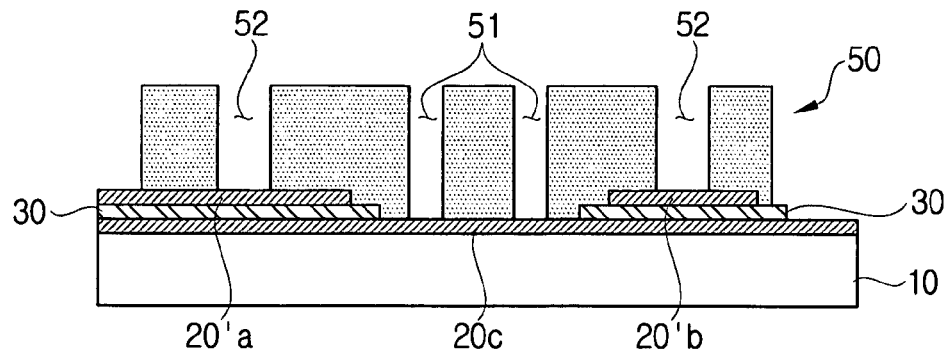
Figure 2F:
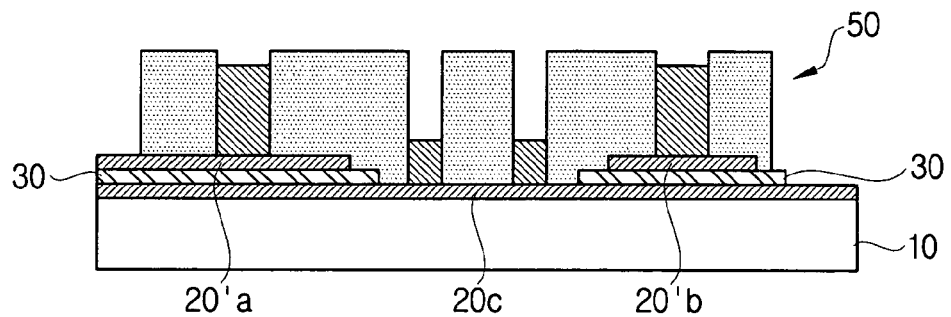

Another characteristic of the present invention, as shown in FIGS. 2E and 2F, is that two metal structures 60 and 70, whose heights are different from each other, can be implemented by a plating process that uses a single plating mold 50 and is performed just once. Therefore, a simplified process can be achieved in comparison with the conventional method.

The present invention will now be described in more detail.

As shown in FIG. 2A, after the first seed layer 20 is deposited with a predetermined thickness on the semiconductor substrate 10, the insulating layer 30 is deposited, and the second seed layer 20' is formed with a predetermined thickness on the insulating layer 30 through a deposition process.

Thereafter, as shown in FIG. 2B, the second seed layer 20' is patterned through a photolithography process and etched so that portions 20'a and 20'b, on which the second metal structure 70 will be formed, are formed.

As shown in FIGS. 2C and 2D, the insulating layer 30 is patterned through the photolithography process and etched, and a part of the first seed layer 20 is exposed so that a portion 20c, on which the first metal structure 60 will be formed, is formed.

Photoresists 41 and 42 (FIG. 2B through FIG. 2D), used in the photolithography process, are removed, and a plating mold 50 is formed on the upper part of the patterned structure, as shown in FIG. 2E. The plating mold 50 is formed by a conventional method such as the photolithography process. However, according to an embodiment of the present invention, a first groove 51 that corresponds to the portion 20c, on which the first metal structure is formed, and a second groove 52 that corresponds to the portions 20'a and 20'b, on which the second metal structure is formed, co-exist in the plating mold 50.

Subsequently, as shown in FIG. 2F, the plating process is performed using the plating mold 50, so that a metal is used to fill in each of the grooves 51 and 52. At this time, different currents are respectively applied to the first seed layer 20 and the second seed layer 20', which are electrically separated to make the plating thickness of the metal respectively filled in the grooves 51 and 52 different. Accordingly, the first metal structure 60 and the second metal structure 70, whose heights are different from each other, are formed at once by a plating process performed just once.

While the conventional method requires that the plating mold forming process and the plating process to obtain two metal structures having different heights be performed twice, respectively, the method according to the present invention requires that the plating mold forming process and the plating process be performed just once, respectively, to obtain two metal structures having different heights and having a construction considerably similar to one formed with the conventional method from the viewpoint of the drawings.

Figure 2G:
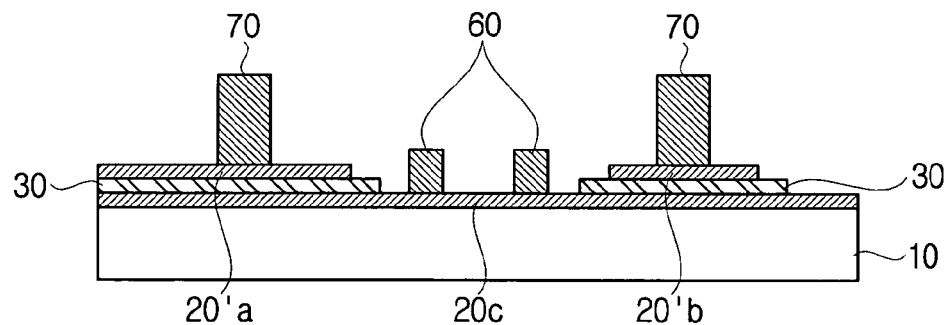

After the plating process, the plating mold 50 used for the plating process is removed so that the metal, which is filled to different thickness in the grooves 51 and 52, is exposed. Accordingly, the first metal structure 60 and the second metal structure 70, whose heights are different from each other, are realized as shown in FIG. 2G.

Figure 2H:
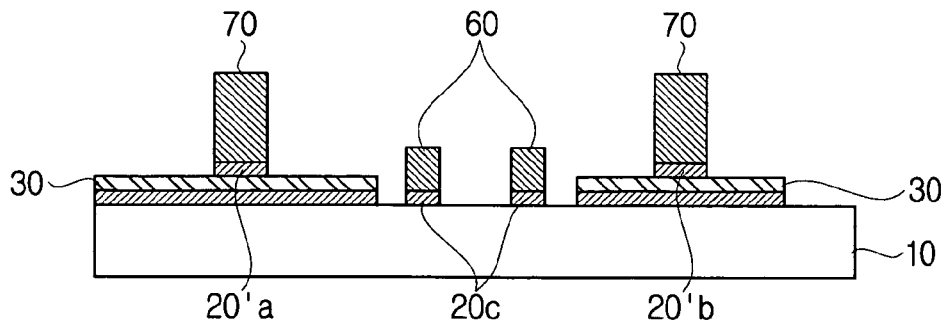

Finally, as shown in FIG. 2H, the unnecessary, residual portions of the first seed layer 20 and second seed layer 20' are removed, thereby completing the manufacturing of the metal structure.

Referring to FIG. 2H, although the first seed layer 20 and the second seed layer 20' are illustrated as partially remaining, the remaining part may be completely removed or remain as shown in FIG. 2H depending on the shape and purpose of the metal structure.

Furthermore, although an exemplary embodiment where the first metal structure 60 and the second metal structure 70 are both made of the same material has been described, metal structure portions, which have different materials with respect to each other, can also be manufactured through a simplified process when compared to the conventional method. However, in this case, the plating process should be performed twice, depending on the material of the metal structure.

The two plating processes are performed in such a manner that, after the plating mold is formed, the first plating process is performed using the material of the first metal structure and the second plating process is performed using the material of the second metal structure.

As described above, in the method for manufacturing a metal structure having different heights according to embodiments of the present invention, although the number of seed layer deposition processes, which are relatively simple, has increased, the number of plating mold forming processes and the number of plating processes, which are relatively complicated and difficult, are reduced. Thus, on the whole, the process is considerably simplified.

Therefore, productivity improvement and quality improvement can be achieved. Furthermore, since contamination of the substrate can be reduced in comparison with the conventional method, malfunctions due substrate contamination can be prevented, and yield improvement can also be achieved.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A method for manufacturing a metal structure having different heights comprising the steps of:
   forming a first seed layer on a semiconductor substrate; depositing an insulating layer on the first seed layer and forming a second seed layer thereon;
   making a pattern on the second seed layer and the insulating layer;
   forming a plating mold having a first groove corresponding to the first seed layer and a second groove corresponding to the second seed layer on an upper part of the patterned structure;
   forming plating layers having different thicknesses on the first groove and the second groove, respectively, of the plating mold by performing a plating process while applying different currents on the first seed layer and the second layer, respectively;
   forming a first metal structure and a second metal structure having different heights with respect to each other by removing the plating mold and exposing the plating layer; and
   removing unnecessary residual portions of the first seed layer and second seed layer.

2. The method as claimed in claim 1, wherein the first seed layer and the second seed layer are electrically separated.

* * * * *